US012218094B2

United States Patent
Wang et al.

(10) Patent No.: US 12,218,094 B2
(45) Date of Patent: Feb. 4, 2025

(54) ELECTRONIC PACKAGE STRUCTURE AND METHOD FOR MANUFACTURING THE SAME

(71) Applicant: Advanced Semiconductor Engineering, Inc., Kaohsiung (TW)

(72) Inventors: Wei-Jen Wang, Kaohsiung (TW); Yi Dao Wang, Kaohsiung (TW); Tung Yao Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/610,185

(22) Filed: Mar. 19, 2024

(65) Prior Publication Data

US 2024/0222306 A1    Jul. 4, 2024

Related U.S. Application Data

(63) Continuation of application No. 17/535,407, filed on Nov. 24, 2021, now Pat. No. 11,935,855.

(51) Int. Cl.
*H01L 23/00* (2006.01)
*H01L 23/498* (2006.01)

(52) U.S. Cl.
CPC ........ *H01L 24/16* (2013.01); *H01L 23/49822* (2013.01); *H01L 24/73* (2013.01); *H01L 24/81* (2013.01); *H01L 2224/10122* (2013.01); *H01L 2224/10145* (2013.01); *H01L 2224/16145* (2013.01); *H01L 2224/16227* (2013.01); *H01L 2224/73204* (2013.01); *H01L 2224/81203* (2013.01); *H01L 2224/81224* (2013.01)

(58) Field of Classification Search
CPC .......... H01L 24/16; H01L 24/73; H01L 24/81
See application file for complete search history.

(56) References Cited

U.S. PATENT DOCUMENTS 6,774,497 B1    8/2004    Qi et al.
9,484,291 B1    11/2016   Dhandapani et al.
(Continued)

OTHER PUBLICATIONS

Non-Final Office Action for U.S. Appl. No. 17/535,407, issued Aug. 3, 2023, 10 pages.
(Continued)

*Primary Examiner* — Errol V Fernandes
(74) *Attorney, Agent, or Firm* — FOLEY & LARDNER LLP (57) ABSTRACT

An electronic package structure and a method for manufacturing the same are provided. The electronic package structure includes a first electronic component, a second electronic component, an interconnection element, an insulation layer, and an encapsulant. The second electronic component is disposed adjacent to the first electronic component. The interconnection element is disposed between the first electronic component and the second electronic component. The insulation layer is disposed between the first electronic component and the second electronic component and has a side surface and a top surface connecting to the side surface. The encapsulant surrounds the interconnection element and at least partially covers the top surface of the insulation layer and has an extended portion in contact with the side surface of the insulation layer.

20 Claims, 5 Drawing Sheets (56) References Cited

U.S. PATENT DOCUMENTS

| | | |
|---|---|---|
| 2008/0061437 A1 | 3/2008 | Kohara et al. |
| 2011/0049725 A1 | 3/2011 | Topacio et al. |
| 2011/0222256 A1 | 9/2011 | Topacio |
| 2015/0228617 A1* | 8/2015 | Lee .................. H01L 24/81 257/772 |
| 2017/0056995 A1* | 3/2017 | Collins ............. B23K 1/0056 |

OTHER PUBLICATIONS

Notice of Allowance for U.S. Appl. No. 17/535,407, issued Nov. 9, 2023, 7 pages.

* cited by examiner

ELECTRONIC PACKAGE STRUCTURE AND METHOD FOR MANUFACTURING THE SAME

CROSS-REFERENCE TO RELATED APPLICATION

This application is a continuation of U.S. patent application Ser. No. 17/535,407, filed Nov. 24, 2021, the content of which is incorporated herein by reference in its entirety.

BACKGROUND

1. Technical Field

The present disclosure relates generally to electronic package structures and methods for manufacturing the same.

2. Description of the Related Art

Undesired warpage of an electronic component may occur due to a CTE (coefficient of thermal expansion) mismatch between a substrate or a printed circuit board and the electronic component bonded thereon. The warpage may cause the distance between a surface of the electronic component and a surface of the substrate to vary from edge to center. For example, a distance between an edge of a surface of the electronic component and a surface of the substrate may be greater than that between a center of the surface of the electronic component and the surface of the substrate. As such, the conductive layers on the edge of the surface of the electronic component may not be able to successfully bond to the corresponding conductive layers on the substrate as they are spaced farther apart, which may affect performance and reliability of the electronic component. For these and other reasons, various electronic package structures and methods for manufacturing the same are being developed.

SUMMARY

In some arrangements, an electronic package structure includes a first electronic component, a second electronic component, an interconnection element, an insulation layer, and an encapsulant. The second electronic component is disposed adjacent to the first electronic component. The interconnection element is disposed between the first electronic component and the second electronic component. The insulation layer is disposed between the first electronic component and the second electronic component and has a side surface and a top surface connecting to the side surface. The encapsulant surrounds the interconnection element and at least partially covers the top surface of the insulation layer and has an extended portion in contact with the side surface of the insulation layer.

In some arrangements, a method for manufacturing an electronic package structure includes: providing a first electronic component including a first conductive layer and a second electronic component including a second conductive layer; pressing the first electronic component to partially interconnect the first conductive layer and the second conductive layer; and applying a condensed energy on the first electronic component to completely interconnect the first conductive layer and the second conductive layer.

In some arrangements, an electronic package structure includes an electronic component and an encapsulant. The electronic component is connected to a carrier through a connection structure. The encapsulant accommodates the connection structure and includes an extension between the connection structure and the carrier. The extension is configured to hinder delamination between the encapsulant and an upper surface of the carrier.

DETAILED DESCRIPTION

Spatially relative terms, such as "top," "bottom," "beneath," "below," "above," "over," "on," "upper," "lower," "left," "right," "vertical," "horizontal," "side" and the like, may be used herein for ease of description of one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected or coupled to the other element, or intervening elements may be present.

Figure 1:
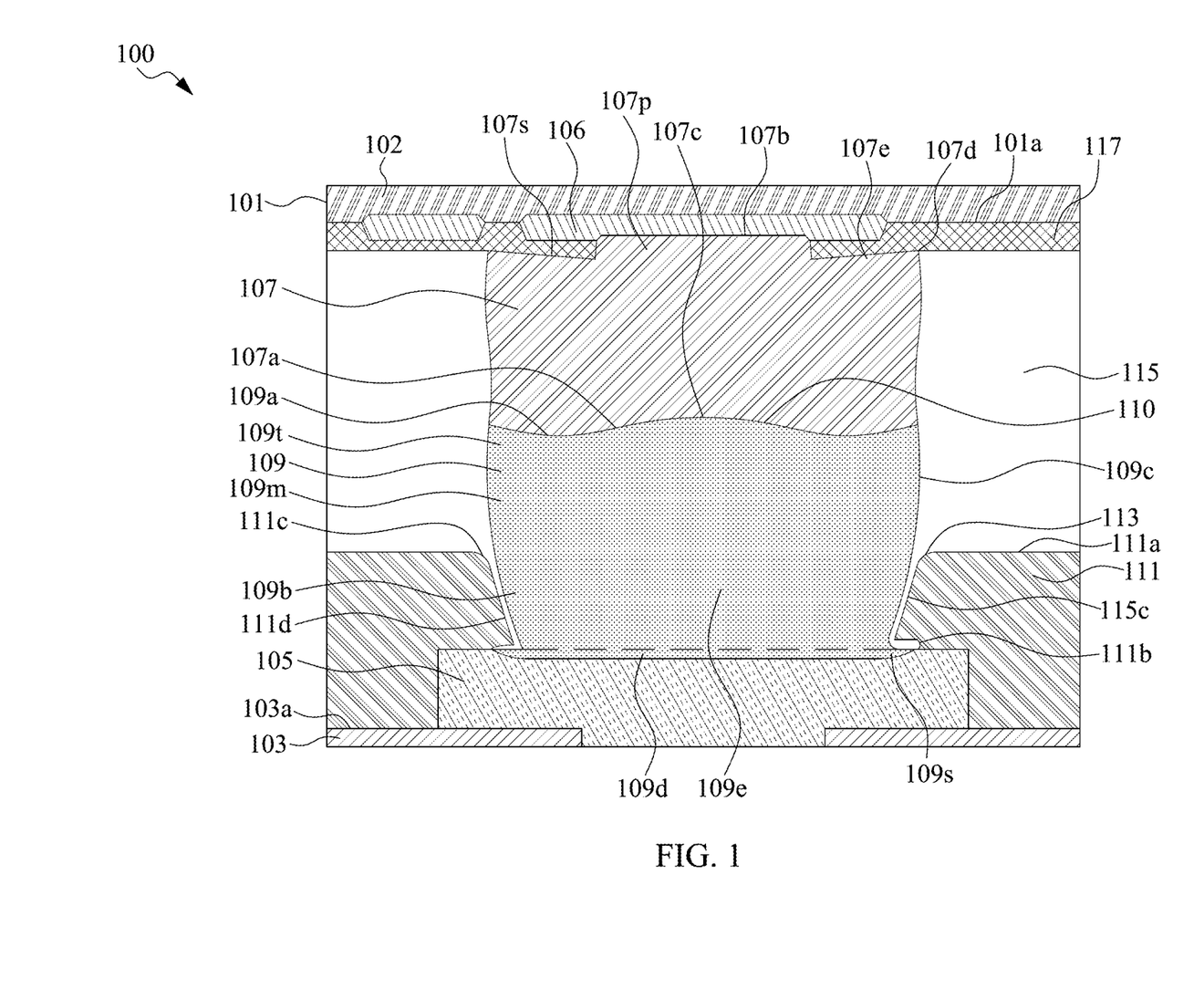
FIG. 1 illustrates a cross-sectional view of an electronic package structure according to some arrangements.

FIG. 1 illustrates a cross-sectional view of an electronic package structure 100 according to some arrangements of the present disclosure. The electronic package structure 100 of FIG. 1 includes a first electronic component 101, a second electronic component 103, an interconnection element 109, an insulation layer 111, and an encapsulant 115.

The first electronic component 101 may include at least one first pad 106 disposed adjacent to a lower surface 101*a* of a main body 102 thereof. The first electronic component 101 may be or include an active component (e.g., a die or a chip). In some examples, the first electronic component 101 may be or include a die. A conductive bump 107 may be disposed adjacent to or on the lower surface 101*a* of the main body 102. For example, in some arrangements, the conductive bump 107 may be disposed adjacent to or on the first pad 106 of the main body 102. The conductive bump 107 may electrically connect to the lower surface 101*a* of the main body 102 through the first pad 106. In some examples, the conductive bump 107 is disposed on (e.g., physically contacts) the first pad 106.

The conductive bump 107 has a first surface (an upper surface) 107*b* facing the first electronic component 101 and a second surface (a lower surface) 107*a* opposite to the first surface 107*b*. An edge 107*d* of the first surface 107*b* of the conducive bump 107 may incline toward the first electronic component 101. The edge 107*d* of the first surface 107*b* of the conductive bump 107 may be closer to the main body 102 than a non-edge portion of the first surface 107*b* is. The first surface 107*b* may include an inclined surface 107*s*. In some examples, the inclined surface 107*s* slopes down from the edge 107*d* to a center of the first surface 107*b*. The first surface 107b may have a sharp corner at the edge 107d from a cross-sectional perspective. The second surface 107a may be an uneven surface. In some arrangements, the second surface 107a may be or include a curved surface. A recess 107c may be located at the second surface 107a. The recess 107c may be located at or adjacent to a center of the second surface 107a. A width of the conductive bump 107 may be greater than a width of the first pad 106. The conductive bump 107 may be a pillar or a solder/stud bump.

The second electronic component 103 is disposed adjacent to the first electronic component 101. The second electronic component 103 has an upper surface 103a facing the second surface 107a of the conductive bump 107 and the lower surface 101a of the main body 102. The second electronic component 103 may include a circuit pattern on the upper surface 103a and/or a circuit pattern embedded therein. A second pad 105 may be disposed adjacent to or on (e.g., physically contact) the upper surface 103a of the second electronic component 103. The second pad 105 may be a part of the circuit pattern of the second electronic component 103 or may electrically connect to the circuit pattern of the second electronic component 103. The second electronic component 103 may be, for example but not limited to, a carrier, a substrate, a die or a chip, a quad flat no-lead (QFN) package, a dual flat no-lead (DFN) package, a lead frame, a printed circuit board, an interposer, or a redistribution layer. In some examples, the second electronic component 103 is a substrate or a printed circuit board.

The interconnection element 109 is disposed between the first electronic component 101 and the second electronic component 103. The interconnection element 109 may be disposed between the conductive bump 107 and the second pad 105. The interconnection element 109 may electrically connect to the conductive bump 107 and the second pad 105. The interconnection element 109 may bond to the conductive bump 107 and the second pad 105. The interconnection element 109 may be configured to join the conductive bump 107 to the second pad 105. The interconnection element 109 has a first surface (an upper surface) 109a facing the conductive bump 107. The first surface (an upper surface) 109a may also face the main body 102 of the first electronic component 101. The first surface 109a of the interconnection element 109 may be an uneven surface. The first surface 109a may be or include a curved surface. In some examples where the interconnection element 109 connects to the conductive bump 107 directly, the first surface 109a (or the second surface 107a of the conductive bump 107) is also the interface 110 at which the conductive bump 107 and the interconnection element 109 connects. The first surface 109a of the interconnection element 109 may conform to the shape of the second surface 107a of the conductive bump 107. In some arrangements, the conductive bump 107 together with the interconnection element 109 may be referred to as "connection structure" or "electrical connection structure."

The interconnection element 109 may include a base 109d and a body 109e connecting to the base 109d and farther from the second pad 105 than the base 109d is. The base 109d may directly contact the second pad 105. A width of the base 109d may be greater than a width of the body 109e. The base 109d may include a skirt portion 109s. The body 109e may include a narrow top portion 109t, a wide middle portion 109m, and a narrow bottom portion 109b. The wide middle portion 109m may connect to the narrow top portion 109t and the narrow bottom portion 109b and form a substantially continuous and curved lateral surface 109c extending from the interface 110 to the base 109d. The lateral surface 109c may be considered substantially continuous when no obvious turning points can be observed under a specific microscope magnification. The interconnection element 109 may include, for example, a soldering material. The soldering material may include Au, Cu, Ni, Sn or a combination of two or more thereof, but is not limited thereto. In some arrangements, the soldering material may include AuSn, CuSn, NiSn, or a combination of two or more thereof, but is not limited thereto.

The insulation layer 111 is disposed between the first electronic component 101 and the second electronic component 103. The insulation layer 111 may be disposed adjacent to or on (e.g., physically contact) the upper surface 103a of the second electronic component 103. The insulation layer 111 has a first surface (an upper surface or a top surface) 111a facing the first electronic component 101 and a second surface (a lower surface or a bottom surface) 111b opposite to the first surface 111a. A side surface 111d connects to the top surface 111a and the bottom surface 111b. The insulation layer 111 may cover at least a portion of the second pad 105. The insulation layer 111 may cover an edge (e.g., a peripheral edge) of the second pad 105. In some examples, the insulation layer 111 covers at least a portion of the second pad 105 and defines a gap 113 with the interconnection element 109. In some arrangements, the interconnection element 109 has a portion (e.g., 109b and 109d) embedded in the insulation layer 111 and connected to the second pad 105 and the gap 113 is defined by the insulation layer 111 and the embedded portion of the interconnection element 109. The gap 113 may extend between the first surface 111a of the insulation layer 111 and the second surface 111b of the insulation layer 111. In some arrangements, the gap 113 may extend from the first surface 111a of the insulation layer 111 to underneath the second surface 111b of the insulation layer 111. In some arrangements, the second surface 111b may be spaced from the second pad 105 and the base 109d of the interconnection element 109 by a portion of the gap 113. A portion of the base 109d may be between the insulation layer 111 and the second pad 105. The insulation layer 111 may include a curved corner 111c adjacent to the gap 113. In some examples, the corner 111c may be a rounded corner. The insulation layer 111 may be, for example, a solder mask (the material of which is, for example, polyimide (PI)), or a passivation layer (the material of which is, for example, a metal oxide).

The encapsulant 115 is disposed between the first electronic component 101 and the second electronic component 103. In some examples, the encapsulant 115 is disposed around the interconnection element 109. In some examples, the encapsulant 115 surrounds the interconnection element 109 and at least partially covers the top surface 111a of the insulation layer 111. In some examples, the encapsulant 115 accommodates the interconnection element 109. In some examples, at least an extended portion 115c of the encapsulant 115 is in contact with the side surface 111d of the insulation layer 111. By contacting the extended portion 115c of the encapsulant 115 with the side surface 111d of the insulation layer 111, the contact surface areas between the encapsulant 115 and the insulation layer 111 may be increased so the encapsulant 115 may hold on to the insulation layer 111 more tightly, which may improve the adhesion of the insulation layer 111 to the second electronic component 103 and diminish the occurrence of the delamination of the insulation layer 111 from the second electronic component 103.

In some examples, at least an extended portion 115c of the encapsulant 115 is in the gap 113. In some examples, at least a portion of an extension 115c of the encapsulant 115 is in the gap 113 and configured to hinder delamination between the encapsulant 115 and the upper surface 103a of the second electronic component 103 (or the first surface 111a of the insulation layer 111) as the extension 115c may provide mold lock effect to the insulation layer 111. In some examples, the extension 115c may be configured to enhancing the adhesion between the encapsulant 115 and the upper surface 103a of the second electronic component 103 (or the first surface 111a of the insulation layer 111). In some examples where the second electronic component 103 is a carrier and the body 109e of the interconnection element 109 includes a soldering material, the extension 115c is disposed between the soldering material 109 and the carrier 103 (or the insulation layer 111). The encapsulant 115 may include an epoxy resin, a molding compound (e.g., an epoxy molding compound or other molding compounds), polyimide, a phenolic compound or material, a material with a silicone dispersed therein, or a combination thereof. In some arrangements, the encapsulant 115 may include an underfill material. In some arrangements, the encapsulant 115 may include fillers, the material of which is, for example, silica and/or carbon, for reducing stress on the substrate and warpage of a resulting electronic package.

By providing a gap 113 defined by the interconnection element 109 and the first insulation layer 111 and filling into the gap a portion (i.e., 115c) of the encapsulant, a mold lock effect may be provided so the encapsulant 115 may not be easily delaminated from the second electronic component 103 (or the first insulation layer 111). Accordingly, the adhesion effect of the encapsulant 115 to the second electronic component 103 (or the first insulation layer 111) may be improved.

In some arrangements, the electronic package structure 100 further includes a second insulation layer 117 adjacent to or disposed on (e.g., physically contact) the lower surface 101a of the first electronic component 101. The second insulation layer 117 may be disposed between the first electronic component 101 and the conductive bump 107 and between the first electronic component 101 and the encapsulant 115. The second insulation layer 117 may be disposed around a protrusion portion 107p of the conductive bump 107. The portion 107e of the conductive bump 107 may protrude beyond a level of the second insulation layer 117. In some examples, a portion 107e of the conductive bump 107 may protrude against the second insulation layer 117. The second insulation layer 117 may be, for example, a solder mask (the material of which is, for example, polyimide (PI)), or a passivation layer (the material of which is, for example, a metal oxide).

Figure 2:
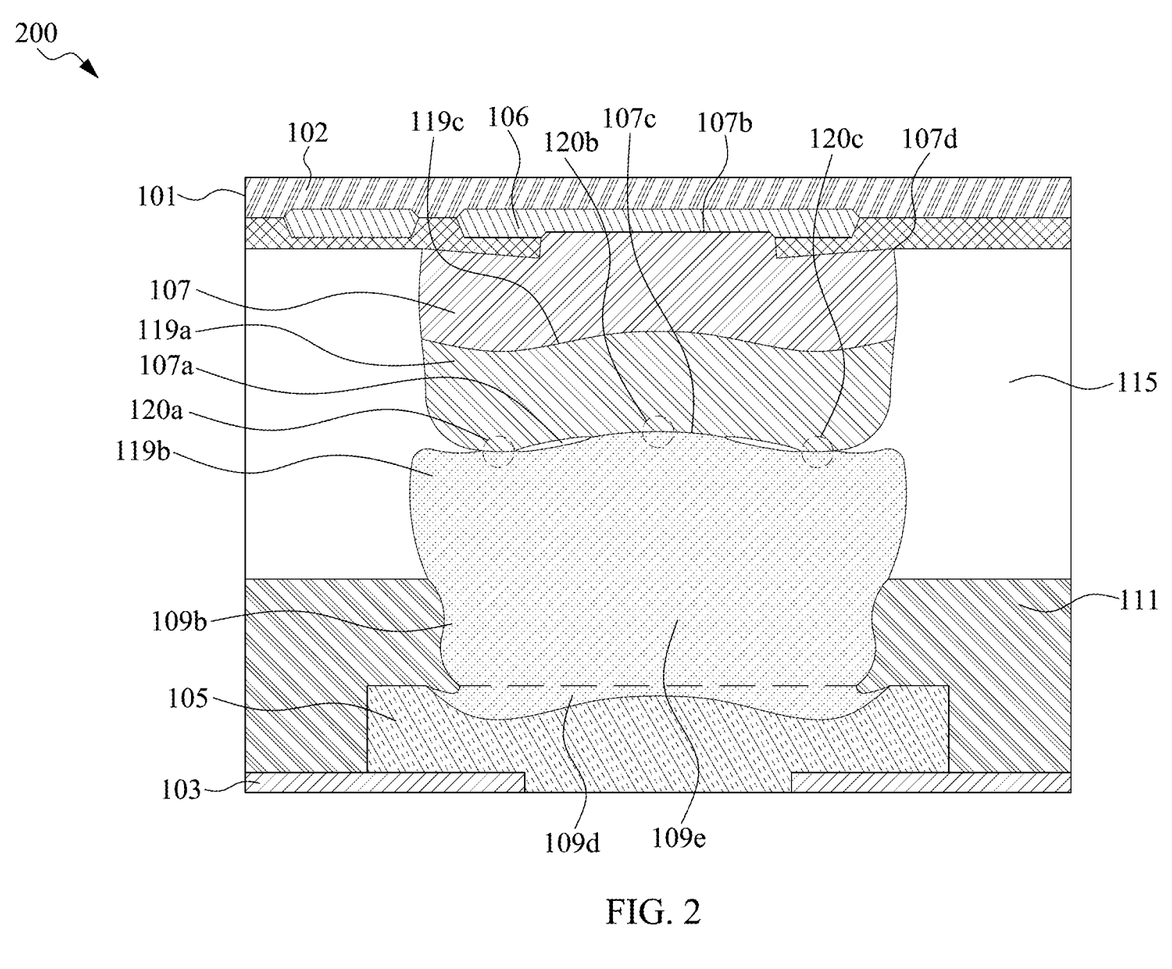
FIG. 2 illustrates a cross-sectional view of an electronic package structure according to some arrangements.

FIG. 2 illustrates a cross-sectional view of an electronic package structure 200 according to some arrangements of the present disclosure. The electronic package structure 200 illustrated in FIG. 2 is similar to that illustrated in FIG. 1 with a difference being that a first conductive layer 119a and a second conductive layer 119b is present in the electronic package structure 200. As illustrated in FIG. 2, the first conductive layer 119a is disposed on the conductive pump 107 and the second conductive layer 119b is disposed on the second pad 105. The first conductive layer 119a may partially contact the second conductive layer 119b. In some examples, the first conductive layer 119a may contact the second conductive layer 119b at one or more portions (e.g., 120a, 120b and/or 120c). In some examples, the first conductive layer 119a may contact the second conductive layer 119b at a center portion (e.g., 120b) of the interface between the first conductive layer 119a and the second conductive layer 119b. Since the first conductive layer 119a does not connect to the second conductive layer 119b completely, the bonding strength of the connection structure between the first electronic component 101 and the second electronic component 103 may not be as strong as that shown in FIG. 1. In some examples, the electronic package structure 200 may be formed by pressing the first electronic component 101 to contact at least a portion of the first conductive layer 119a to at least a portion of the second conductive layer 119b by a thermal compression bonding process.

Figure 3:
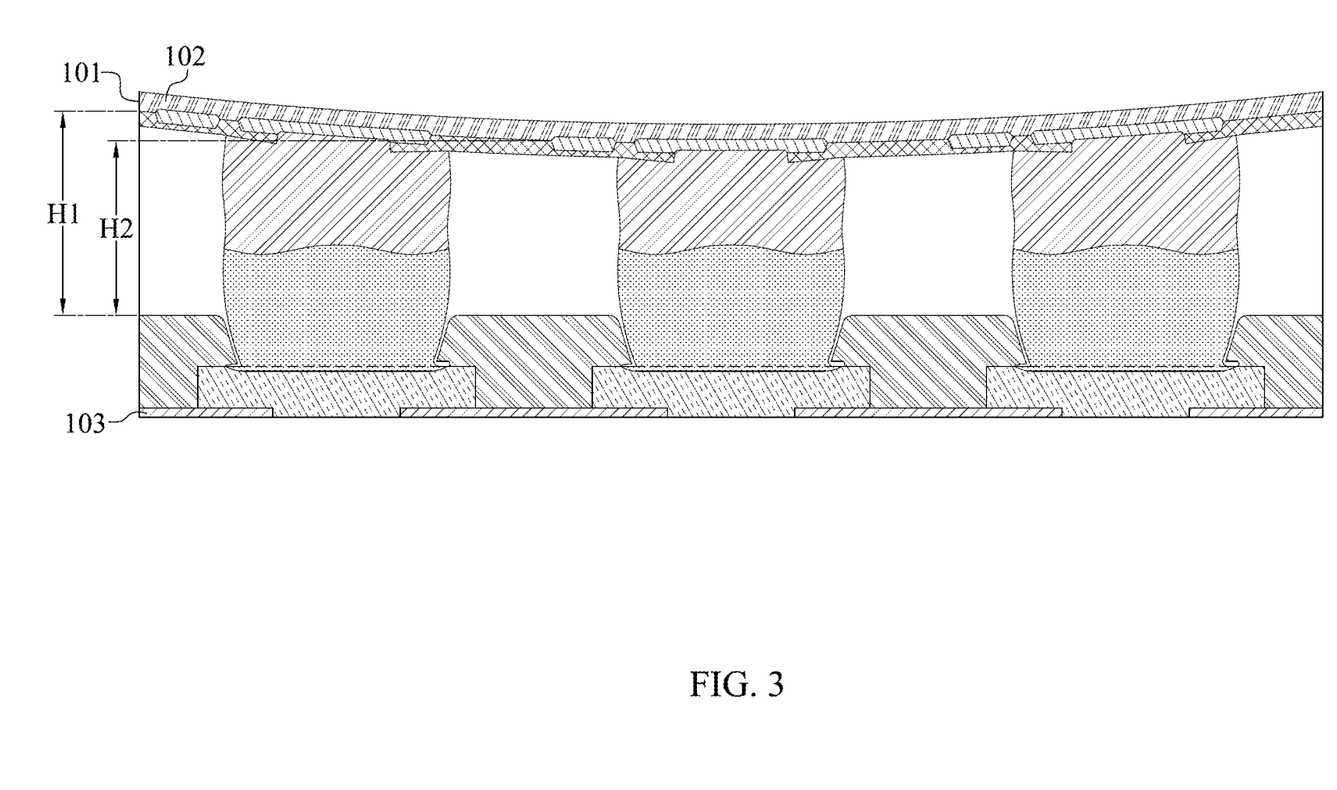
FIG. 3 illustrates a cross-sectional view of an electronic package structure according to some arrangements.

FIG. 3 illustrates a cross-sectional view of an electronic package structure 300 according to some arrangements of the present disclosure. The electronic package structure 300 illustrated in FIG. 3 includes a plurality of connection structures illustrated in FIG. 1. In some examples, a warpage of the first electronic component 101 may occur due to a CTE (coefficient of thermal expansion) mismatch between the first electronic component 101 and the second electronic component 103. As such, a first distance (height) H1 between an edge of a surface of the first electronic component 101 and a surface of the second electronic component 103 may be greater than a second distance (height) H2 between a center of the surface of the first electronic component 101 and the surface of the substrate. The warpage may be alleviated by adopting a thermal compression bonding process. In some arrangements, although slight warpage may still occur after carrying out a thermal compression bonding process, the first electronic component 101 may still successfully connect to the second electronic component 103 through the plurality of the connection structures illustrated in FIG. 1.

Figure 4A:
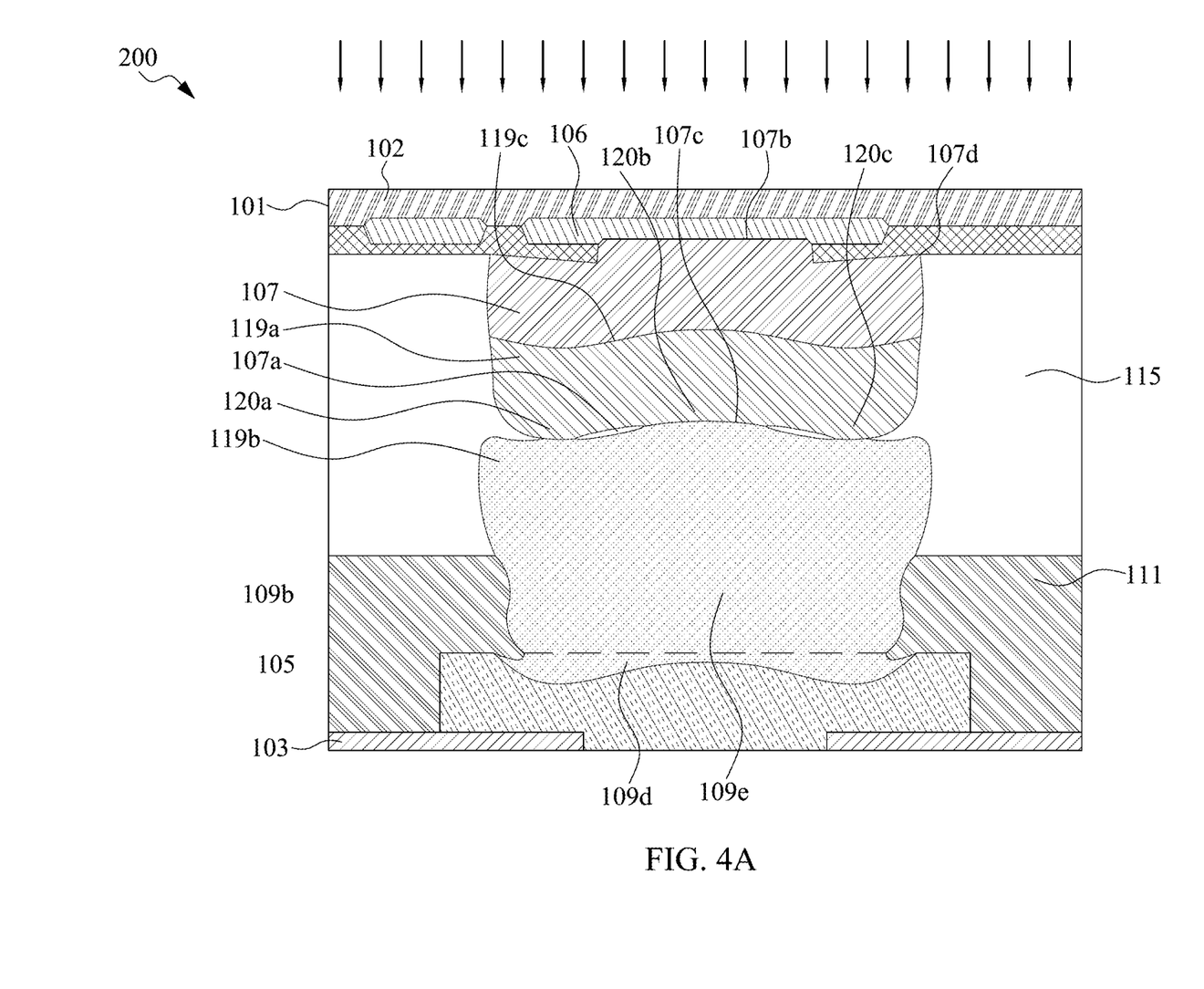
FIG. 4A and FIG. 4B illustrate various operations in a method for manufacturing an electronic package structure according to some arrangements.
Figure 4B:
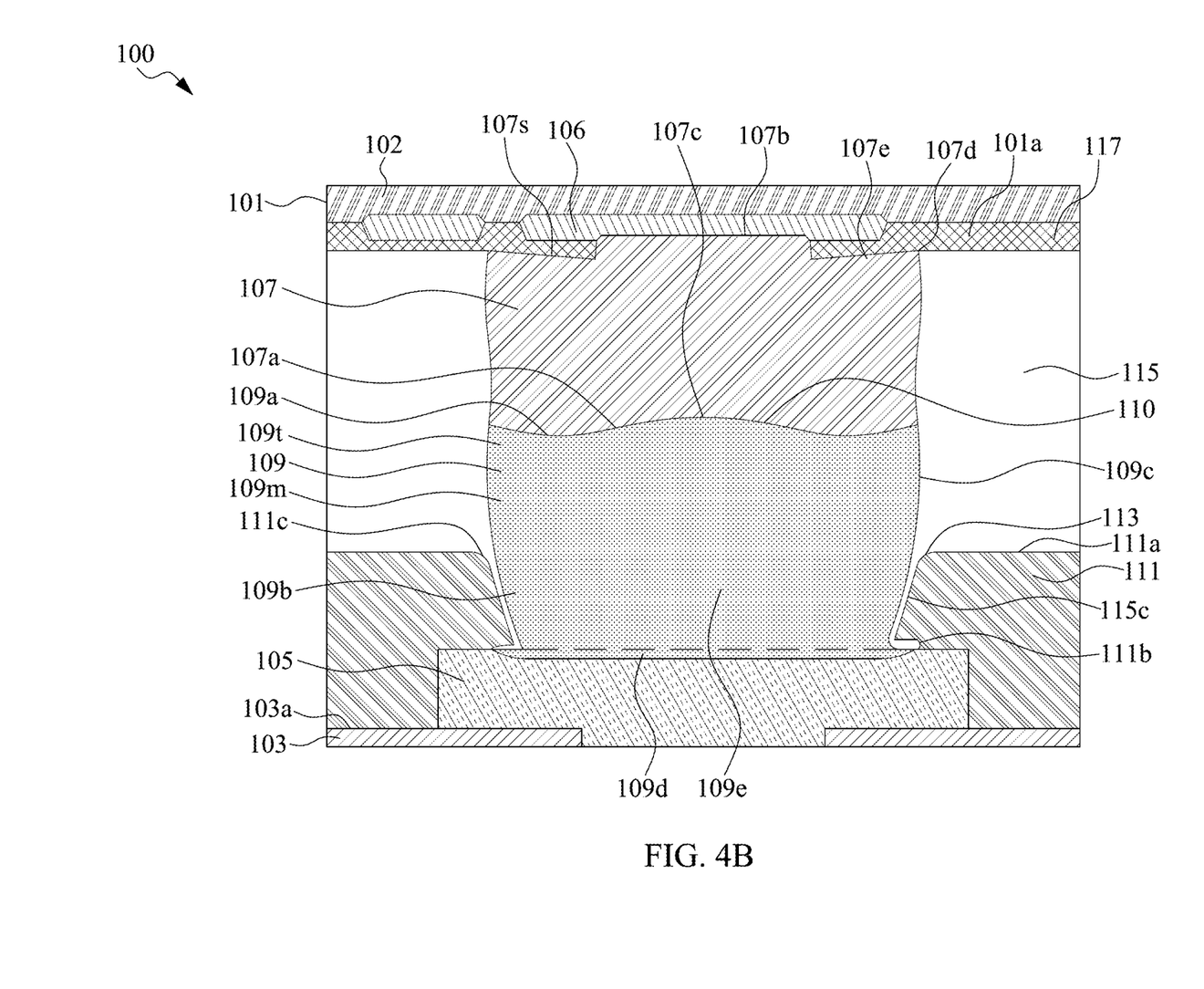

FIGS. 4A-4B illustrate various operations in a method for manufacturing an electronic package structure such as the electronic package structure of FIG. 1.

Referring to FIG. 4A, a first electronic component 101 and a second electronic component 103 103 are provided. In some examples, the first electronic component 101 is a die and the second electronic component 103 is a substrate. The first electronic component 101 may include a first conductive layer 119a disposed on a conductive bump 107 of the first electronic component 101. The second electronic component 103 may include a second conductive layer 119b disposed on a second pad 105 of the second electronic component 103. The first conductive layer 119a may be partially interconnected to the second conductive layer 119b by pressing the first electronic component 101 against the second electronic component 103 (or pressing the second electronic component 103 against the first electronic component 101) via a thermal compression bonding process. In some examples, the thermal compression bonding process is carried out to form a contact between at least a portion of the first conductive layer 119a and at least a portion of the second conductive layer 119b, which may partially joint the first conductive layer 119a to the second conductive layer 119b. An edge 107d of a top surface 107b of the conductive bump 107 may incline toward the first electronic component 101, a recess 107c may occur at a bottom surface 107a of the conductive bump 107 by the first conductive layer 119a, and an uneven surface 119c of the first conductive layer 119a facing the first electronic component 101 may be formed because of the pressure applied during the thermal compression bonding process. Afterwards, an electronic package structure (e.g., an electronic package structure 200 as is illustrated in of FIG. 2) may be obtained.

By pressing the first electronic component 101 and/or the second electronic component 103 under a pressure prior to applying a condensed energy on the first electronic component 101 to fully joint the first conductive layer 119a to the second conductive layer 119b, the extent of the warpage of the first electronic component 101 may be reduced, so that the height difference between the first height H1 between an edge of a surface of the first electronic component 101 and a surface of the second electronic component 103 and the second height H2 between a center of the surface of the first electronic component 101 and the surface of the second electronic component 103 may be decreased. Accordingly, the connection between the first conductive layer 119a and the second conductive layer 119b may be improved as they will not be parted far by the warpage.

Referring to FIG. 4B, the first conductive layer 119a may be completely interconnected to the second conductive layer 119b and form a joint structure after application of a condensed energy (such as laser energy) on the first electronic component 101. The condensed energy may be supplied by carrying out for example, a laser assisted bonding process, but is not limited thereto). The first conductive layer 119a connects to the second conductive layer 119b at an uneven interface 110. In some examples, the first metal layer 119a may completely joint to the second metal layer 119b at this stage. Afterwards, an electronic package structure (e.g., an electronic package structure 100 as is illustrated in of FIG. 1) may be obtained. Since a pressure is applied to the first electronic component 101 and/or the second electronic component 103 to partially joint the first conductive layer 119a to the second conductive layer 119b prior to applying the condensed energy, the first conductive layer 119a may form a complete joint structure with the second conductive layer 119b more easily when the condensed energy is applied afterwards. In some examples, a gap 113 is formed between the connection structure (including the conductive bump 107 and the interconnection element 109) and the first insulation layer 111 on the second electronic component 103 because the second conductive layer 119b may shrink or condense due to the condensed energy. A filling material is filled around the connection structure to form an encapsulant 115. A portion (i.e., 115c) of the encapsulant 115 may be filled into the gap 113. As a result, a mold lock effect may be provided so the encapsulant 115 may not be easily delaminated from the second electronic component 103 (or the first insulation layer 111). Accordingly, the adhesion effect of the encapsulant 115 to the second electronic component 103 (or the first insulation layer 111) may be improved, which may further improve the strength of the connection structure between the first electronic component 101 and the second electronic component 103.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 µm, no greater than 1 µm, or no greater than 0.5 µm.

As used herein, the singular terms "a," "an," and "the" may include plural referents unless the context clearly dictates otherwise. In the description of some arrangements, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, subdivided, or reordered to form an equivalent method without departing from the teachings of the present disclosure. Accordingly, unless specifically indicated herein, the order and grouping of the operations are not limitations.

What is claimed is:

1. A method for manufacturing an electronic package structure, comprising:
   providing a first electronic component comprising a first conductive layer;
   performing a thermal treatment on the first electronic component without applying any laser energy on the first electronic component; and
   applying a laser energy on the first electronic component after performing the thermal treatment.

2. The method of claim 1, further comprising:
   providing a second conductive layer; and
   performing the thermal treatment on the first electronic component to joint the first conductive layer to the second conductive layer.

3. The method of claim 2, further comprising:
   applying a compression to cause the first conductive layer and the second conductive layer to press against each other.

4. The method of claim 3, wherein the thermal treatment is performed on the first electronic component during applying the compression.

5. The method of claim 3, wherein applying the compression comprises pressing a second electronic component including the second conductive layer.

6. The method of claim 5, wherein pressing the second electronic component is earlier than applying the laser energy on the first electronic component.

7. The method of claim 2, further comprising:
providing a conductive bump having a recess; and
disposing a portion of the first conductive layer within the recess.

8. The method of claim 7, wherein disposing the portion of the first conductive layer within the recess is earlier than performing the thermal treatment on the first electronic component.

9. A method for manufacturing an electronic package structure, comprising:
providing a first electronic component comprising a first conductive layer;
providing a second conductive layer;
partially jointing the first conductive layer to the second conductive layer; and
applying a condensed energy on the first electronic component to enlarge a joint region formed by partially jointing the first conductive layer to the second conductive layer.

10. The method of claim 9, further comprising applying a compression on the first conductive layer and the second conductive layer.

11. The method of claim 10, further comprising performing a thermal treatment on the first electronic component to partially joint the first conductive layer to the second conductive layer.

12. The method of claim 10, further comprising:
providing a second electronic component comprising the second conductive layer; and
pressing the second electronic component to partially joint the first conductive layer to the second conductive layer.

13. The method of claim 12, wherein applying the condensed energy on the first electronic component is later than pressing the second electronic component.

14. The method of claim 9, further comprising applying the condensed energy to completely joint the first conductive layer to the second conductive layer.

15. The method of claim 9, wherein the condensed energy is configured to shrink or condense the second conductive layer.

16. The method of claim 15, further comprising forming a gap between the second conductive layer and an insulation layer.

17. A method for manufacturing an electronic package structure, comprising:
providing a first electronic component comprising a first conductive layer and a second electronic component comprising a second conductive layer contacting the first conductive layer;
performing a thermal compression bonding process on the first electronic component and the second electronic component; and
applying a condensed energy on the first electronic component.

18. The method of claim 17, wherein the thermal compression bonding process is configured to alleviate a warpage of the first electronic component.

19. The method of claim 17, wherein the thermal compression bonding process comprises pressing the second electronic component.

20. The method of claim 18, wherein the first electronic component comprises a first surface facing the second electronic component, the second electronic component comprises a second surface facing the first electronic component, an edge portion of the first surface of the first electronic component is separated from the second surface of the second electronic component by a first distance in a first direction substantially perpendicular to the second surface, a center portion of the first surface is separated from the second surface by a second distance different from the first distance in the first direction, and the thermal compression bonding process is configured to reduce a difference between the first distance and the second distance.

* * * * *